ized Boron Emitters," Applied Physics Letters, 2008, Issue

United States Patent
Hilali et al.

(10) Patent No.: US 10,749,061 B1
(45) Date of Patent: Aug. 18, 2020

(54) SOLAR CELL EDGE INTERCONNECTS

(71) Applicant: ZHEJIANG KAIYING NEW MATERIALS CO., LTD., Zhejiang (CN)

(72) Inventors: Mohamed M. Hilali, San Ramon, CA (US); Zhiyong Li, Los Altos, CA (US)

(73) Assignee: ZHEJIANG KAIYING NEW MATERIALS CO., LTD., Haining (CN)

( * ) Notice: Subject to any disclaimer, the term of this patent is extended or adjusted under 35 U.S.C. 154(b) by 0 days.

(21) Appl. No.: 16/803,300

(22) Filed: Feb. 27, 2020

Related U.S. Application Data

(62) Division of application No. 16/421,196, filed on May 23, 2019, now Pat. No. 10,622,502.

(51) Int. Cl.
| | | |
|---|---|---|
| *H01L 31/05* | (2014.01) | |
| *H01L 31/042* | (2014.01) | |
| *H01L 31/18* | (2006.01) | |
| *H01L 31/048* | (2014.01) | |

(Continued)

(52) U.S. Cl.
CPC ............. *H01L 31/05* (2013.01); *H01L 21/50* (2013.01); *H01L 31/048* (2013.01); *H01L 2021/60007* (2013.01); *H01L 2021/60277* (2013.01)

(58) Field of Classification Search
CPC ............................... H01L 31/05; H01L 31/048
See application file for complete search history.

(56) References Cited

U.S. PATENT DOCUMENTS

| | | |
|---|---|---|
| 7,300,606 B2 | 11/2007 | Chung et al. |
| 8,093,491 B2 | 1/2012 | Sridharan et al. |
| 8,952,245 B2 | 2/2015 | Wang et al. |

(Continued)

FOREIGN PATENT DOCUMENTS

| | | |
|---|---|---|
| CN | 101948639 | 1/2011 |
| CN | 102148264 A | 8/2011 |

(Continued)

OTHER PUBLICATIONS

Benick et al., "High Efficiency n-type Si Solar Cells on Al2O3-Passivated Boron Emitters," Applied Physics Letters, 2008, Issue 92, p. 253504.

(Continued)

*Primary Examiner* — Jayne L Mershon

(57) ABSTRACT

Edge interconnects for interconnecting solar cells are disclosed. The edge interconnects include a layer of an electrically conductive adhesive overlying an insulating dielectric layer applied to edge of a solar cell and electrically interconnected to a busbar. Solar cell modules include adjacent solar cells comprising edge interconnects interconnected using an interconnection element. An interconnection element can be a solder paste or a solder containing electrically conductive ribbon. Methods of forming solar cell edge interconnects include applying an insulating dielectric coating to edges of a solar cell, depositing a busbar in proximity to the insulated edges of the solar cell, depositing an electrically conductive adhesive over at least portion of the busbar an over at least a portion of the dielectric layer. Solar cell modules can be formed by interconnecting adjacent solar cells using an interconnection element.

12 Claims, 6 Drawing Sheets

(51) Int. Cl.
*H01L 21/50* (2006.01)
*H01L 21/60* (2006.01)

(56) References Cited

U.S. PATENT DOCUMENTS

| | | | |
|---|---|---|---|
| 9,209,323 | B2 | 12/2015 | Hayashi et al. |
| 9,834,470 | B1 | 12/2017 | Hilali et al. |
| 10,079,318 | B2 | 9/2018 | Hilali et al. |
| 2009/0032087 | A1 | 2/2009 | Kalejs |
| 2010/0308462 | A1 | 12/2010 | Konno et al. |
| 2011/0120531 | A1 | 5/2011 | Nese et al. |
| 2011/0308597 | A1 | 12/2011 | Carroll et al. |
| 2011/0315217 | A1 | 12/2011 | Gee et al. |
| 2012/0000502 | A1* | 1/2012 | Wiedeman .......... H01L 31/0508 136/244 |
| 2012/0015472 | A1 | 1/2012 | Hayashi et al. |
| 2012/0017986 | A1 | 1/2012 | Nakatani |
| 2012/0122272 | A1 | 5/2012 | Rana et al. |
| 2013/0118572 | A1 | 5/2013 | Kim et al. |
| 2013/0126797 | A1 | 5/2013 | Lee et al. |
| 2013/0255770 | A1 | 10/2013 | Carroll et al. |
| 2013/0340815 | A1 | 12/2013 | Kim et al. |
| 2013/0341769 | A1 | 12/2013 | Koehler et al. |
| 2014/0070148 | A1 | 3/2014 | Kim et al. |
| 2014/0124014 | A1 | 5/2014 | Morad et al. |
| 2014/0141164 | A1 | 5/2014 | Hofmann |
| 2014/0299187 | A1 | 10/2014 | Chang et al. |
| 2014/0338747 | A1 | 11/2014 | Choi et al. |
| 2014/0373898 | A1 | 12/2014 | Rogers et al. |
| 2015/0129030 | A1 | 5/2015 | Kapur et al. |
| 2015/0144183 | A1 | 5/2015 | Yang et al. |
| 2015/0200313 | A1* | 7/2015 | Moslehi .............. H01L 31/1804 136/249 |
| 2015/0243807 | A1 | 8/2015 | Raskar et al. |
| 2015/0249167 | A1 | 9/2015 | Zhang et al. |
| 2015/0280024 | A1 | 10/2015 | Song et al. |
| 2015/0280641 | A1 | 10/2015 | Garg et al. |
| 2015/0333197 | A1 | 11/2015 | Takeda et al. |
| 2015/0364622 | A1 | 12/2015 | Jung et al. |
| 2016/0170192 | A1 | 6/2016 | Yamamoto et al. |
| 2016/0251531 | A1 | 9/2016 | Uchida et al. |
| 2017/0087633 | A1 | 3/2017 | Murano et al. |
| 2017/0306172 | A1 | 10/2017 | Koduma |

FOREIGN PATENT DOCUMENTS

| | | |
|---|---|---|
| CN | 102290120 | 12/2011 |
| CN | 102592708 | 7/2012 |
| CN | 102779575 | 11/2012 |
| CN | 103597547 | 2/2014 |
| CN | 104021836 | 9/2014 |
| CN | 104036842 | 9/2014 |
| CN | 104103699 | 10/2014 |
| CN | 104143385 | 11/2014 |
| CN | 104167454 | 11/2014 |
| CN | 104240793 | 12/2014 |
| CN | 104282357 | 1/2015 |
| CN | 104599741 | 5/2015 |
| CN | 104681648 | 6/2015 |
| CN | 104867535 | 8/2015 |
| CN | 104916346 | 9/2015 |
| CN | 104981911 | 10/2015 |
| CN | 105261669 | 1/2016 |
| CN | 205564774 | 9/2016 |
| CN | 106158068 | 11/2016 |
| CN | 106297956 | 1/2017 |
| JP | 2013-074165 | 4/2013 |
| KR | 20020060926 | 7/2002 |
| KR | 101377555 | 3/2014 |
| WO | 2012/135551 | 10/2012 |
| WO | 2016/194882 | 12/2016 |

OTHER PUBLICATIONS

Loozen et al., "Passivation of a Metal Contact with a Tunneling Layer," Energy Procedia, 3rd Workshop on Metallization for Crystalline Silicon Solar Cells, Belgium, 2012, Issue 21, p. 75-83.
Kim et al., "Capillary flow of amorphous metal for high performance electrode," Scientific Reports, 2013, vol. 3, No. 2185, 7 pages.
BYK-336 Silicone surface additive product data sheet, Sep. 2012, 1 page.
BYK Additives & Instruments Paint Additives, Feb. 2009, 15 pages.
Schmidt et al., "Surface Passivation of High-Efficiency Silicon Solar Cells by Atomic-Layer-Deposited Al2O3," Progress in Photovoltaics: Research and Applications, 2008, Issue 16, p. 461-466.
Sigma-Aldrich, Polymethylhydrosiloxane average Mx 1,700-3,200, Product 176206, CAS 63148-57-2, MDL MFCD00084478, 1 page.
Non-Final Office Action for U.S. Appl. No. 15/663,296, dated Sep. 14, 2017, 8 pages.
Non-Final Office Action for U.S. Appl. No. 15/663,187, dated Nov. 15, 2017, 6 pages.
Non-Final Office Action for U.S. Appl. No. 15/839,585, dated Feb. 5, 2018, 17 pages.
Non-Final Office Action for U.S. Appl. No. 15/849,344, dated Mar. 22, 2018, 12 pages.
International Search Report and Written Opinion for Application No. PCT/CN2016/095508, dated May 5, 2017, 8 pages.
International Search Report and Written Opinion for Application No. PCT/CN2016/111036, dated Sep. 1, 2017, 9 pages.
International Search Report and Written Opinion for Application No. PCT/CN2016/111035, dated Sep. 27, 2017, 8 pages.

* cited by examiner

SOLAR CELL EDGE INTERCONNECTS

This application is a divisional of U.S. application Ser. No. 16/421,196 filed on May 23, 2019, now allowed, which is incorporated by reference in its entirety.

FIELD

The present invention relates to edge interconnects for solar cells. The edge interconnects include a layer of an electrically conductive adhesive overlying an insulating dielectric layer applied to edge of a solar cell and electrically interconnected to a busbar. Solar cell modules include adjacent solar cells comprising edge interconnects interconnected using an interconnection element. An interconnection element can be a solder paste or a solder-containing electrically conductive ribbon. Methods of forming solar cell edge interconnects include applying an insulating dielectric coating to edges of a solar cell, depositing a busbar in proximity to the insulated edges of the solar cell, depositing an electrically conductive adhesive over at least a portion of the busbar and over at least a portion of the dielectric layer. Solar cell modules can be formed by interconnecting adjacent solar cells using an interconnection element.

BACKGROUND

Adjacent solar cells can be interconnected using a solder-coated copper ribbon to interconnect busbars on an upper surface of a first solar cell to busbars on a lower surface of a second subcell. Such interconnects leave a gap between adjacent solar cells from about 1 mm to about 2 mm. The ribbons are typically soldered to the busbars thereby potentially exposing the surface of the solar cell to excessive temperatures.

Reducing the gap between adjacent solar cells in a solar cell module can provide increased photovoltaic module power output and efficiency.

SUMMARY

According to the present invention, solar cells comprises: a surface and an edge; a busbar, wherein the busbar is in proximity to the edge; a dielectric layer overlying the edge; and an electrically conductive adhesive overlying at least a portion of the dielectric layer and overlying at least a portion of the busbar.

According to the present invention, solar cell modules comprise: a first solar cell according to the present invention, wherein the first solar cell comprises a first electrically conductive adhesive; a second solar cell according to the present invention, wherein the second solar cell comprises a second electrically conductive adhesive; and an interconnection element interconnecting the first electrically conductive adhesive and the second electrically conductive adhesive.

According to the present invention, photovoltaic modules comprise at least two solar cells according to the present invention.

According to the present invention, power systems comprise a plurality of photovoltaic modules according to the present invention.

According to the present invention, methods of fabricating a solar cell edge interconnect, comprise: depositing a dielectric layer overlying an edge of a solar cell; depositing a busbar metallization in proximity to the edge of the solar cell; and depositing an electrically conductive adhesive overlying at least a portion of the dielectric layer and overlying at least a portion of the busbar to provide a solar cell edge interconnect.

According to the present invention, solar cells comprise an interconnect fabricated using a method according to the present invention.

According to the present invention, photovoltaic modules comprise at least two solar cells according to the present invention.

According to the present invention, power systems comprise a plurality of photovoltaic modules according to the present invention.

According to the present invention, methods of interconnecting solar cells, comprise: contacting a first electrically conductive adhesive of a first solar cell according to the present invention and a second electrically conductive adhesive of a second solar cell according to the present invention with an interconnection element; and bonding the interconnection element to the first and second electrically conductive adhesives to electrically interconnect the first solar cell and the second solar cell.

According to the present invention, solar cells are interconnected using a method according to the present invention.

According to the present invention, photovoltaic modules comprise a solar cell according to the present invention.

According to the present invention, power systems comprise a plurality of photovoltaic modules according to the present invention.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized, and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

The use of small-area solar cells can increase the power output and the efficiency of a photovoltaic system. A typical large-area solar cell can have dimensions, for example, of about 156 mm×156 mm. Small-area solar cells can have an area that is, for example, less than 25%, 20%, or 15% the area of a large-area solar cell. Because the gridlines are shorter, the series resistance is reduced and the busbars can be situated at the edge of the cells. For example, because power loss due to series resistance (R) is related as $P_{loss}=I^2R$ the power loss can be significantly reduced and the fill factor (F) and efficiency should improve with small-area solar cells. Thus, for example, by reducing the size of a solar cell by 50% the power loss due to the cell resistance is reduced to 25%.

Figure 1A:
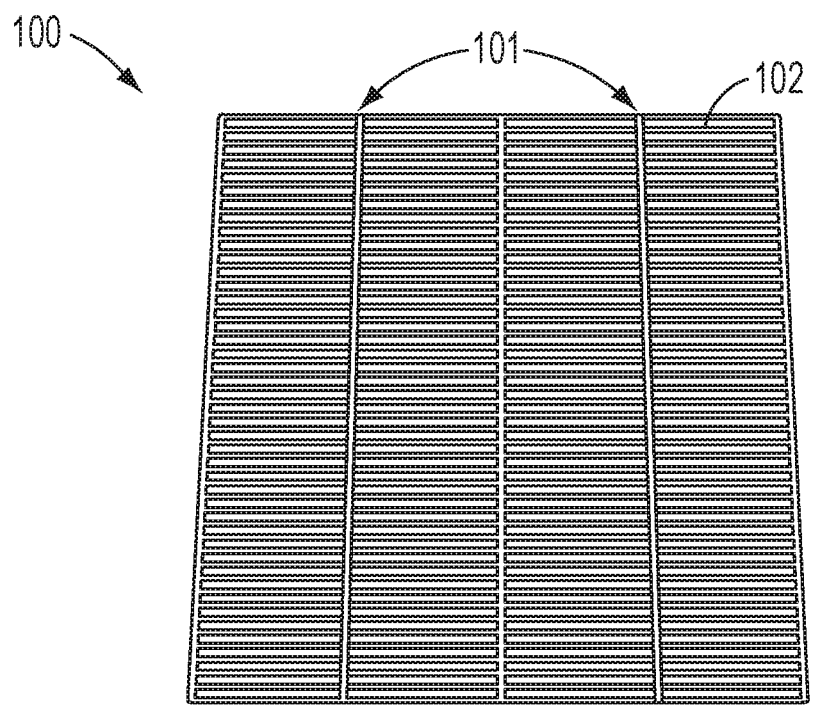
FIGS. 1A and 1B show the front (1A) and back (1B) surfaces of a large area solar cell, which can be cut longitudinally to provide four (4) solar cells of equal size.
Figure 1B:
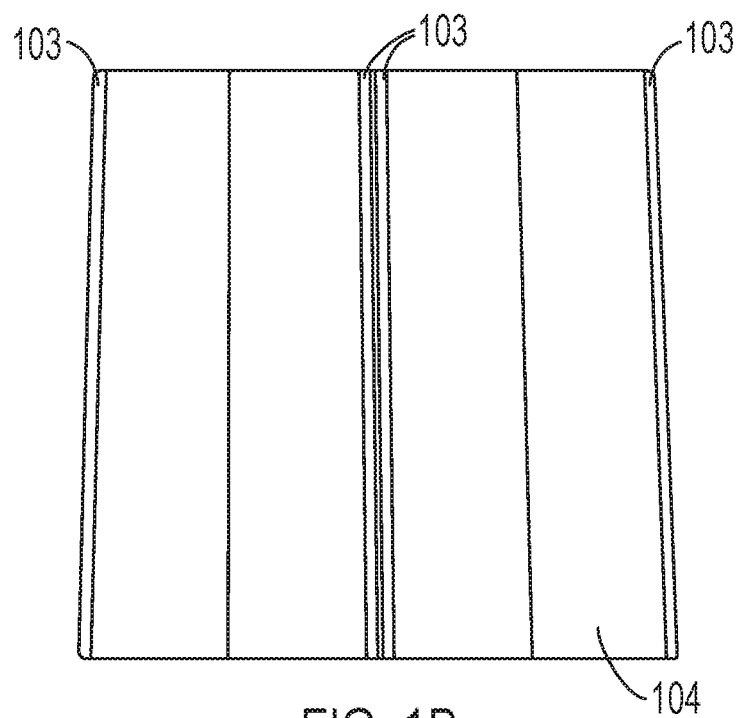

FIGS. 1A and 1B show the frontside (1A) and the backside (1B) of a large area solar cell 100 including frontside busbars 101, frontside Ag grid lines 102, backside busbars 103, and backside Al contact 104. Alternatively, for bifacial solar cells, the backside gridlines can be, for example, Ag. Small-area solar cells can be fabricated, for example, by laser cutting a large-area solar cell into four (4) or more stripes of equal size. Other small area solar cells can be cut from large area solar cells. For example, a large area solar cell having three busbars on each side can be cut into 6 small area solar cell stripes of equal size.

Adjacent small-area solar cells can be interconnected using solder-coated ribbon. For a solder-coated ribbon interconnect, a certain distance is required between adjacent solar cells which can be from 1 mm to 2 mm. Alternative, in a shingled solar cell configuration the backside busbar of an overlying solar cell is directly interconnected to the frontside busbar of an adjacent solar cell resulting in a non-planar configuration. As a result, for shingled solar cells there is a shadowing loss due to the extension of the overlying solar cell above the surface of the underlying solar cell. Thus, in both configurations the active cell area per module area is reduced to various degrees by the interconnects. When multiplied over multiple small-area solar cells used in a module, the reduction in power per area can be significant.

Thus, to employ small-area solar cells to advantage improved interconnects are desired.

The active area of a photovoltaic module can be increased by minimizing the gap between adjacent interconnected solar cells. Solar cell edge interconnects provided by the present disclosure can be used to increase the active solar cell area and thereby the power output and efficiency of power modules formed from small-area solar cells.

Figure 2:
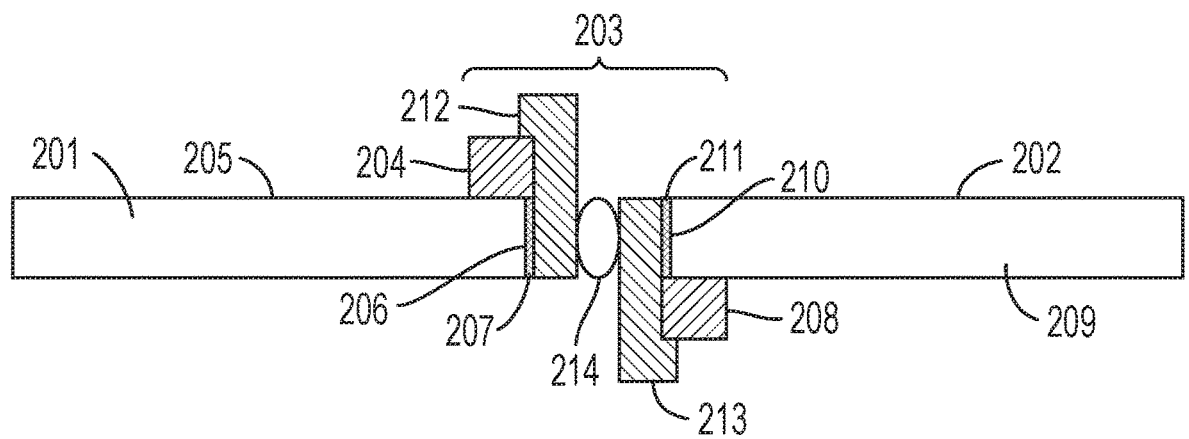
FIG. 2 shows a cross-sectional view of an example of a solar cell interconnect provided by the present disclosure.

A cross-sectional view of a solar cell edge interconnect provided by the present disclosure is shown in FIG. 2. As shown in FIG. 2, a first solar cell 201 is interconnected to a second solar cell 202 through edge interconnect 203. Solar cell 201 includes a busbar 204 on the frontside 205 and situated in proximity to an edge 206 of the first solar cell. An insulating dielectric layer 207 is disposed on at least a portion of the edge 206 of the first solar cell 201. The second solar cell 202 includes a busbar 208 on the backside surface 209 and is situated in proximity to an edge 210 of the second solar cell 202. An insulating dielectric layer 211 is disposed on at least a portion of the edge 210 of the second solar cell 202. Edge interconnect 203 includes an electrically conductive adhesive 212 disposed on at least a portion of the first busbar 204 and overlying at least a portion of the first dielectric layer 207; and an electrically conductive adhesive 213 is disposed on at least a portion of the second busbar 208 and overlying at least a portion of the second dielectric layer 211. The electrically conductive adhesive 212 is electrically interconnected to the first busbar 204, and the second electrically conductive adhesive 213 is electrically interconnected to the second busbar 208.

As shown in FIG. 2, an interconnection element 214 electrically interconnects the first electrically conductive adhesive 212 to the second electrically conductive adhesive 213.

The interconnection element 214 can be weldable such that the interconnection element 214 provides sufficient mechanical integrity and has a low resistance. It can be desirable that the interconnection element maintain the structural integrity of the solar cell module when exposed to thermal stress under typical use conditions.

An interconnection element can comprise, for example, a solder paste or a solder-coated ribbon. An interconnection element can comprise, for example, an electrically conductive elastomer or an electrically conductive elastomeric element.

The surface electrodes of a solar cell such as the frontside and backside gridlines can be made of any suitable electrically conductive material. The surface electrodes can be formed by printing such as by screen printing or ink jet printing, conductive paste over the solar cell surfaces. Examples of suitable paste materials include silver paste, copper paste, glass pastes containing silver, gold paste, carbon paste, nickel paste, aluminum paste, transparent conductive oxide (TCO), such as indium tin oxide (ITO), and aluminum zinc oxide (AZO).

The surface electrodes of the solar cells may be in any suitable patterns, shapes and dimensions, and the interconnection between the surface electrodes and the wiring member may be in any suitable forms.

For example, in a wafer-based solar cell module, each solar cell may comprise a front surface electrode and a back surface electrode, wherein the top surface electrode can comprise a plurality of parallel conductive fingers and two or more conductive busbars perpendicular to and interconnecting the conductive fingers, and wherein the back surface electrode can comprise a layer of conductive paste and two or more conductive busbars. The conductive fingers and the conductive busbars can be formed, for example, of silver paste and the layer of conductive paste on the back surface electrode may be formed of aluminum paste. In such embodiments, the wiring members are interconnected to the front surface and back surface electrodes by adhering to the busbars of the front and back electrodes via an electrically conductive adhesive.

In general, for silicon solar cell metallization applications, thick-film pastes are used to form the conductive grids and metal contacts. Thick-film pastes can include a suspension of conductive metal, glass frit, organic vehicles, and modifiers. Silver is the most common conductive filler used for frontside contact paste. Glass frit is used to bind the functional/conductive phase to a silicon wafer after thermal treatment. The glass frit also etches through anti-reflective and passivation layers to provide ohmic contact between the silver grid and the silicon surface of the solar cell. The organic vehicle can be an organic system that acts as a rheological carrier to control flow and printability of the paste. The organic vehicle can comprise resins, solvents, and additives. The attributes of the metallization paste, in particular the frontside silver paste, is important for achieving high efficiency solar cells. Therefore, the quality and performance of the silver metallization paste affects the economics of solar systems. The screen printing technology that is currently used for the majority of solar cells is being further developed for printing fine-line conductive grids to reduce silver consumption and thereby reduce cost, to reduce shading and thereby increase the current density, and to improve photovoltaic module performance.

An interconnection element can comprise a solder-coated ribbon. A solder-coated ribbon can have a thickness and width, for example, that is less than the thickness of a solar cell being interconnected. The edge of a solder-coated ribbon facing the incident solar radiation can have a substantially flat surface or can have a cross-sectional profile that enhances the ability of incident solar radiation to impinge upon the active regions of the solar cell. For example, the front and back edges of the solder-coated ribbon can have a convex shape or can have be textured.

A solder-coated ribbon can comprise a ribbon of an electrically conductive material such as Cu or Ag, with an exterior coating of a solder or solder alloy. A ribbon can have any suitable cross-section shape such as rectangular, circular, or oval. The exterior surface of the ribbon facing incident solar radiation can be configured to facilitate scattering of incident solar radiation onto active areas of the solar cell. For example, the exterior surface of a ribbon can be convex and/or textured.

Different types of electrically conducive elements can be used. An interconnection element can span the entire length of an edge interconnect or can extend over certain portions of an edge interconnect.

A solder coating can have a thickness, for example, of from 0.5 µm to 70 µm, such as from 10 µm to 50 µm.

The ribbon can be in the form of a thin sheet such as a foil.

Any suitable solder can be used. For example, a solder can comprise from 30 wt % to 100 wt % tin, and one or more of lead, silver, bismuth, zinc, copper, or a combination of any of the foregoing, in an amount from 0 wt % to 50 wt %, where wt % is based on the total weight of the solder alloy.

A dielectric layer can have a thickness, for example, less than 200 µm, less than 10 µm, or less than 50 µm.

A dielectric layer can comprise, for example, $SiO_2$, SiN, or $Al_2O_3$.

A dielectric layer can be deposited on the edges of a solar cell using any suitable semiconductor deposition method such as, for example, plasma enhanced chemical vapor deposition, metal-organic chemical vapor deposition, or molecular beam epitaxy.

When a copper-containing conductive adhesive is used, it can be desirable that the dielectric layer also serve to prevent diffusion of copper from the conductive adhesive into the active region of the solar cell. Other elements such as phosphorus, gold, zinc, carbon, magnesium, indium, titanium, vanadium, chromium, manganese, iron, cobalt, nickel, zirconium, niobium, molybdenum, tantalum and tungsten, can also diffuse into silicon and create recombination centers. Dielectric materials that can serve as a diffusion barrier include, for example, tungsten carbide ($W_2C$), titanium silicon nitride (TiSiN), $ZrB_2$, and amorphous $MnSi_xO_y$. This dielectric can also passivate the edges of Si solar cells, thereby mitigating edge recombination effects. These diffusion barriers can be electrically insulating and can be deposited by chemical vapor deposition (CVD), which is a conformal coating process. Alternatively, other diffusion barriers such as tantalum nitride can be used/deposited using other methods such as physical vapor deposition (PVD), which is not a conformal coating process.

An electrically conductive adhesive can comprise, for example, silver particles, copper particles, or combinations thereof. An electrically conductive adhesive can comprise, for example, from 60 wt % to 90 wt % of electrically conductive particles, where wt % is based on the weight of the electrically conductive adhesive. The electrically conductive particles can have an average particle size, for example, from 0.5 µm to 25 µm. The electrically conductive particles can also include metal-coated particles such as glass, or polymeric particles that are coated with a metal such as Au, Ag, Ni, and/or Cu.

When cured, an electrically conductive adhesive can have a cured thickness, for example, from 20 µm to 200 µm.

The electrically conductive adhesive can comprise a curable resin. The polymer matrix can comprise one or more polymers such as (meth)acrylate copolymers, polyesters, polyurethanes, polysiloxanes, polyethers, epoxy-amine-poly adducts and combinations of any of the foregoing. The resin systems can be thermally curable.

Elastomeric polymers such as ethylene copolymer-based (such as those based on ethylene vinyl acetate (EVA) can also be used, for example, in an alternating pattern with the electrically conductive adhesive (ECA) on the edge of the solar cell.

The electrically conductive adhesive can comprise, for example, copper, a copper alloy, silver, a silver alloy, nickel, a nickel alloy, or a combination of any of the foregoing.

An electrically conductive adhesive can comprise Cu and/or Ag pastes that can be cured at low temperature such as from 120° C. to 220° C. Electrically conductive adhesives are designed to provide an elastic interconnect to reduce mechanical stress between the solar cell interconnect and the solar cell.

Examples of suitable electrically conductive adhesives include DD-1662K® series suitable for nozzle/syringe dispensing (commercially available from Kyoto Elex Co., Ltd.).

Examples of suitable solder pastes include Loctite® HF 250DP suitable for nozzle/syringe dispensing-type applications (commercially available from Henkel).

An electrically conductive adhesive can comprise, for example, an epoxy resin, a polyimide resin acrylic resin, or a polycarbonate resin.

Solar cell edge interconnects provided by the present disclosure can be used with any suitable solar cell.

Solar cells comprising an edge interconnect provided by the present disclosure comprise a surface and an edge, a busbar in proximity to the edge, a dielectric layer overlying the edge, and an electrically conductive adhesive overlying at least a portion of the dielectric layer and overlying at least a portion of the busbar.

A solar cell can comprise a wafer-based solar cell such as a c-Si or an mc-Si solar cell; a thin-film solar cell such as an a-Si, μc-Si, CdTe, copper indium selenide (CIS), or copper-indium-gallium selenide (CIGS) solar cells, light absorbing dyes, or organic semiconductor-based solar cells A busbar can be at the edge of the solar cell or, for example, within less than 25 μm, less than 50 μm, less than 100 μm, or less than 200 μm from the edge of the solar cell. A busbar can be located near the edge of the solar cell to maximize the active area of the solar cell. A busbar can comprise any suitable material such as a conductive Ag thick-film. The busbar can be interconnected to a plurality of grid lines.

The edge of the solar cell can comprise a dielectric layer. The dielectric layer can comprise a dielectric material such as $SiO_2$, SiN, or $Al_2O_3$. The purpose of the dielectric layer is to insulate the edge of the solar cell from the electrically conductive adhesive forming the edge interconnect.

Methods provided by the present disclosure include methods of fabricating a solar cell edge interconnect and methods of interconnecting solar cells using the solar cell edge interconnects to provide solar cell modules.

Methods of fabricating a solar cell edge interconnect provided by the present disclosure can comprise depositing a dielectric layer overlying an edge of a solar cell, depositing a busbar metallization on the frontside and backside surface of the solar cell in proximity to the edge of the solar cell, and depositing an electrically conductive adhesive overlying at least a portion of the dielectric layer and overlying at least a portion of the busbar to provide a solar cell edge interconnect.

Small-area solar cells such as solar cells having areas, for example, from about 2,000 mm$^2$ to 8,000 mm$^2$, can be cut from larger area solar cells by laser grooving followed by mechanical separation. For example, a large-area solar cell can be separated into stripes having a width, for example, from about 15 mm to about 60 mm, and a length, for example, from 100 mm to 200 mm.

A dielectric layer can be deposited using any suitable semiconductor deposition method such as, for example, chemical vapor deposition, molecular beam epitaxy, physical vapor deposition, or remote plasma enhanced chemical vapor deposition.

To deposit the dielectric layer on an edge of solar cell, multiple solar cells can be stacked and a dielectric layer deposited on exposed edges of the stacked solar cells. In this way, a dielectric layer can be simultaneously applied to multiple solar cells. A dielectric layer can be applied to a first edge and to a second edge, where the second edge is opposite the first edge. A dielectric layer can be applied to edges that will be in proximity to the busbars. A dielectric layer can be deposited to cover the edge of each of the solar cells in the stack. A dielectric layer can be applied to all four edges of a solar cell.

Figure 3:
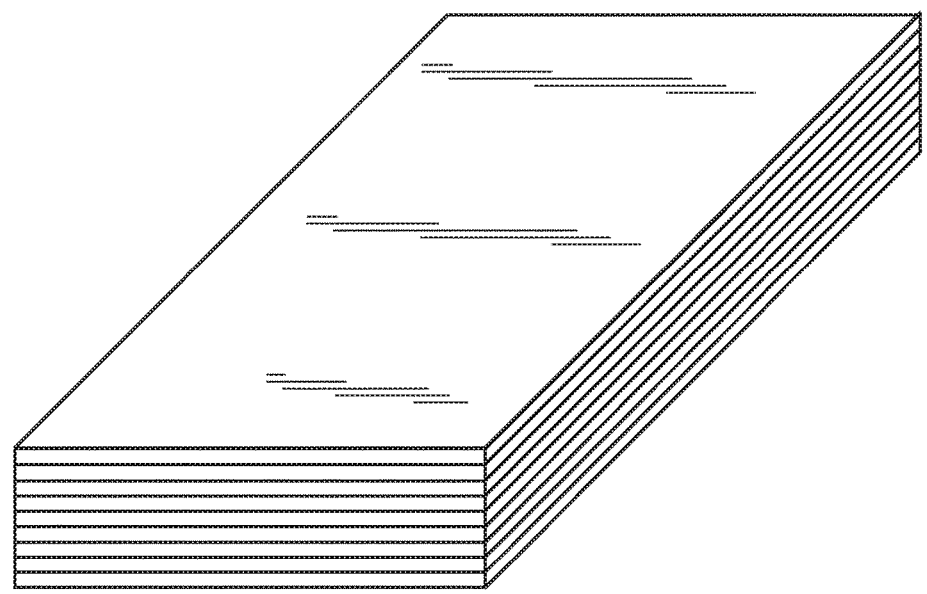
FIG. 3 shows an example of a stack of solar cells used in depositing an edge dielectric layer.

FIG. 3 shows a stack of solar cells.

After depositing a dielectric layer on opposing edges of a solar cell, individual solar cells can be separated from the stack and the busbar and gridline metallization can be applied to the surfaces of the solar cell using any suitable materials and methods. For example, a busbar/gridline metallization paste can be applied to the surface of a solar cell using screen printing. To maximize the active area of the solar cell and to minimize the resistance of an edge interconnect, the busbars can be in proximity to the edges of the solar cell having the dielectric layers. For example, the busbars can be within less than 100 μm of the edges of a solar cell. Busbars and gridlines can be deposited/printed on the upper and lower surfaces of the solar cell. After the metallization paste is applied, the metallization paste can be dried and fired in a radiation-lamp belt furnace to provide the conductive busbars and gridlines.

Figure 4:
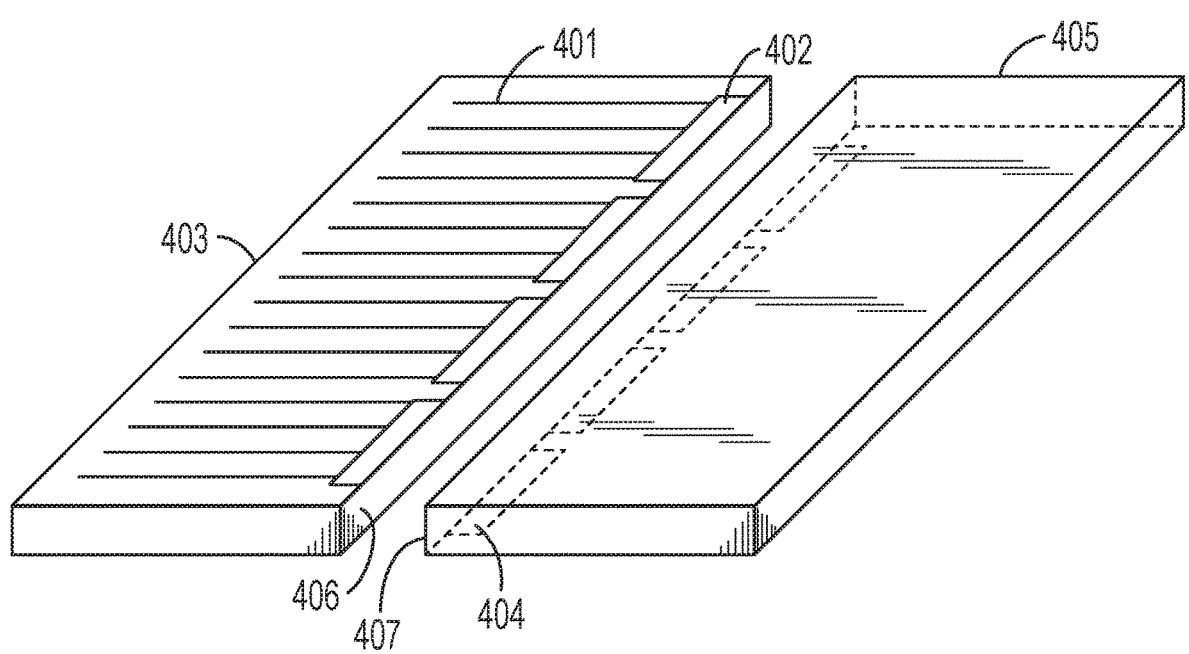
FIG. 4 shows a perspective view of two solar cells, with a first solar cell having a frontside busbar and gridlines, and a second solar cell having a backside busbar and gridlines.

FIG. 4 shows a configuration of busbars and gridlines on two solar cells. Gridlines 401 are interconnected to busbar 402 on the frontside of a first solar cell 403, and gridlines (not shown) are interconnected to busbar 404 of the backside of a second solar cell (405). The edges of both solar cells are coated with dielectric layer (406/407).

After the busbars and gridlines are formed, an electrically conductive adhesive can be applied to the surface of the dielectric layer or to a portion of the surface of the dielectric layer and to the surface of the busbar or to a portion of the surface of the busbar. When cured, the electrically conductive adhesive is electrically interconnected to the busbar and is electrically insulated from the edge of the solar cell by the dielectric layer.

The electrically conductive adhesive can be applied to the solar cell edge using, for example, additive manufacturing such as by pulsed three-dimensional printing or by extrusion three-dimensional printing. The electrically conductive adhesive can be applied to the edge of the solar cell using, for example, transfer printing. An electrically conductive adhesive can cover the dielectric layer or can be patterned to cover selected portions of the dielectric layer. The electrically conductive adhesive can be applied to cover the dielectric layer, to cover a portion of the dielectric layer, to contact the entire length of a busbar, to contact a portion of the length of the busbar, or a combination of any of the foregoing.

After the electrically conductive adhesive is applied to the edge of the solar cell, the electrically conductive adhesive can be cured at a temperature, for example, from 120° C. to 200° C. The heat can be applied, for example, by passing the solar cell through a belt oven.

Figure 5:
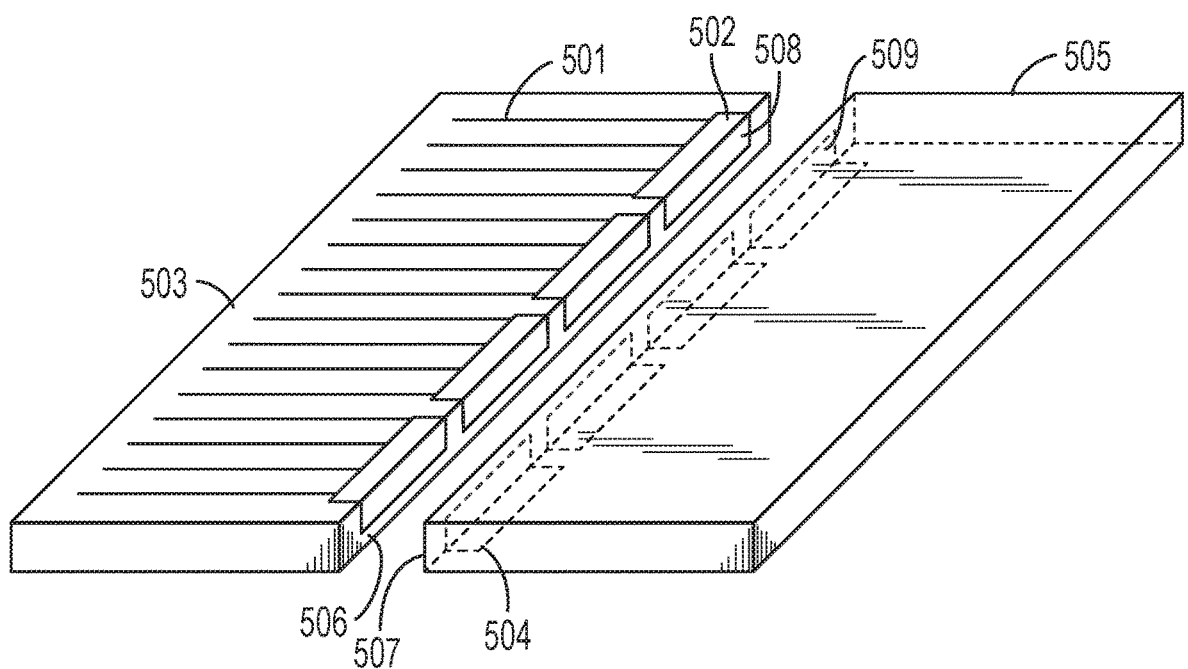
FIG. 5 shows the solar cells shown in FIG. 4 with an electrically conductive adhesive deposited on at least a portion of the busbar and at least a portion of the edge of each of the two solar cells.

FIG. 5 shows two solar cells having an electrically conductive adhesive applied to the busbars and to the edges of the solar cell. FIG. 5 shows gridlines 501 interconnected to busbar 502 on the frontside of the first solar cell 503, and gridlines (not shown) interconnected to busbar 504 on the backside of the second solar cell 505. An electrically conductive adhesive (508/509) covers the busbars 502/504) and extends over the edges of the solar cells to partially cover the dielectric layer (506/507).

After edge interconnects are formed to both the positive and negative busbars of a solar cell, the solar cells can be interconnected to form modules.

To form solar cell modules, edge interconnects of two solar cells can be interconnected with an electrically conductive interconnection element that has low resistivity and can provide mechanical support for the interconnect. The interconnection element, when cured, can maintain the structural integrity of the solar cell interconnect during use conditions.

Two or more solar cells can be interconnected by the edge interconnects to form a solar cell module.

It is desirable that the interconnection element be thin so as to minimize the separation between adjacent solar cells in order to reduce the resistance of the interconnect and to increase the active area of the solar cell module per module area.

An interconnection element can have a width, for example, that is less than the thickness of the solar cells being interconnected. For example, an interconnection element can have a width less than 250 µm, less than 225 µm, 200 µm, less than 175 µm, less than 150 µm, less than 125 µm, less than 100 µm, or less than 75 µm. An interconnection element can have a thickness, for example, from 50 µm to 250 µm, from 75 µm to 225 µm, from 100 µm to 200 µm, or from 125 µm to 175 µm.

An interconnection element can have a thickness that is less than the thickness of the solar cells being interconnected. For example, an interconnection element can have a thickness less than 200 µm, less than 175 µm, less than 150 µm, less than 125 µm, less than 100 µm, or less than 75 µm. An interconnection element can have a thickness, for example, from 50 µm to 200 µm, from 75 um to 175 µm, or from 100 µm to 150 µm.

Two solar cells can be interconnected by bringing two opposing solar cell edge interconnects into proximity and interconnected using an interconnection element.

An interconnection element can comprise, for example, a solder paste or a solder-coated ribbon.

When a solder paste is used as the interconnection element, two edge interconnects can be brought into proximity and a solder paste can be applied within the gap separating the opposing edge interconnects. The solder paste can be applied, for example, using additive manufacturing such as using three-dimensional printing.

Alternatively, a solder paste can be applied to the electrically conductive adhesive on an edge of a solar cell and an edge interconnect of a second solar cell can be brought into contact with the electrically conductive adhesive and subsequently cured to interconnect the two solar cells. The edge of the second solar cell may or may not have an applied solder paste before joining the edges of the two solar cells.

After the solder paste is applied and the solar cell edges are positioned, the solder paste can be cured at a temperature, for example, from 200° C. to 240° C., to interconnect the solar cells.

When a solder-coated ribbon is used as the interconnection element, the two edge interconnects can be brought into close proximity, and the solder-coated ribbon can be placed within the gap between the two opposing edge interconnects. The solder-coated ribbon can be press-fit into the gap or otherwise inserted into the gap between the edge interconnects and the opposing edge interconnects. If necessary the opposing edge interconnects can be brought closer together to adjust the separation and/or pressure of the edge interconnects on the interconnection element to facilitate the formation of an electrically and mechanically viable interconnect.

Certain portions of the gap between opposing edge interconnects can comprise a component configured to enhance the mechanical strength of the solar cell module interconnect. For example, the component need not be electrically conductive. The component can be thermally conductive and/or thermal dissipative. The component can be rigid, elastomeric, or a combination thereof. The component can be, for example, a thermoset, thermoplastic, metal, metal alloy, ceramic, or composite material. A component can be situated in between electrically conductive regions of the module interconnect.

A non-electrically conductive elastomeric component can be printed on the edge of the solar cell using, for example, three-dimensional printing, to form an alternating pattern between the conductive adhesive on the first and second solar cells and the elastomeric component, which can be facing each other on both adjacent solar cells. The elastomeric polymer can be cross-linked during the electrically conductive adhesive curing or can be subsequently printed and cross-linked during lamination of the photovoltaic module. Alternatively, an elastomeric polymer printed between the electrically conductive adhesive patterns on the edges of the solar cells may not be necessary if the electrically conductive adhesive such as ethylene vinyl acetate (EVA) front and back laminating layers of the photovoltaic module fill the gaps between the electrically conductive adhesive patterns on the edges of the adjacent solar cells. In this case, the EVA may provide the necessary flexible adhesive bond that relieves mechanical stresses between the solar cells.

After the interconnection element has been deposited or positioned between the opposing solar cell edge interconnects, the interconnect can be heated to cause an electrically conductive bond such as a solder to the electrically conductive adhesive to electrically interconnect two solar cells to form a solar cell module. The solder paste or solder-coated ribbon can be bonded to the electrically conductive adhesive, for example, bypassing the module pre-assembly through a radiation lamp heated or resistance heated oven.

The process can be used to simultaneously and/or sequentially interconnect additional solar cells.

Figure 6A:
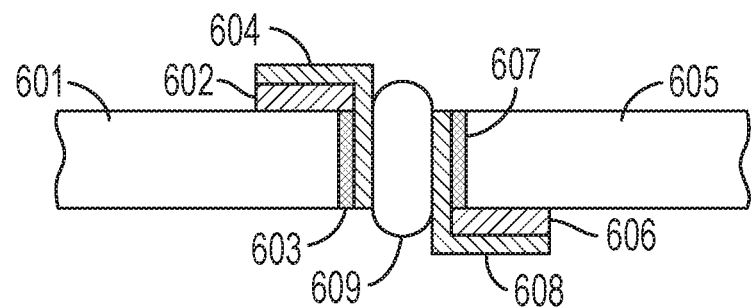
FIGS. 6A-6D show side views of solar cells interconnected using the interconnects provided by the present disclosure. The adjacent solar cells can be interconnected using, for example, a solder paste (6A) or a solder-coated ribbon (6B), a solder-coated ribbon having convex outer surface (6C), or a solder-coated ribbon having textured outer surfaces (6D).
Figure 6B:
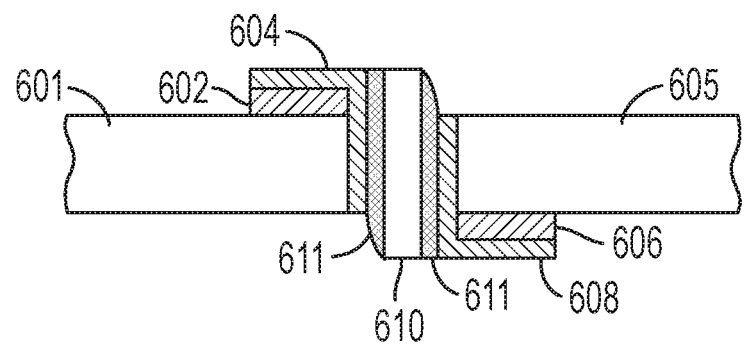
Figure 6C:
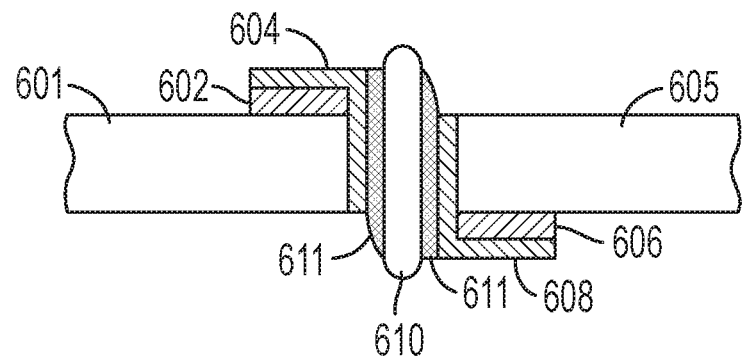
Figure 6D:
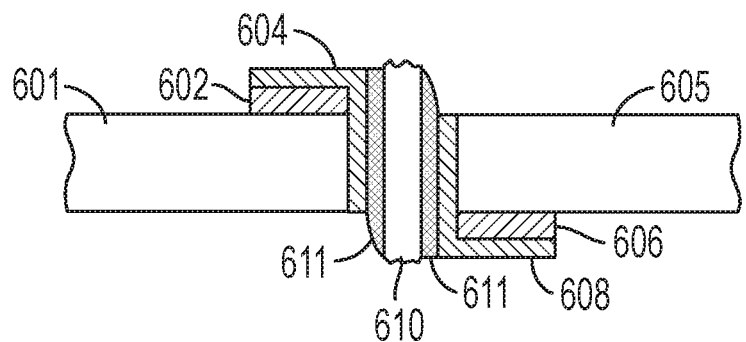

FIGS. 6A-6D show cross-sectional views of solar cells interconnected using edge interconnects provided by the present disclosure. The cross-sectional views include a first solar cell 601, a busbar 602, a dielectric layer 603, an electrically conductive adhesive 604, a second solar cell 605, a busbar 606, a dielectric layer 607, an electrically conductive adhesive 608, and an interconnection element 609. In FIG. 6A the interconnection element is a solder paste, in FIG. 6B the interconnection element is a solder-coated ribbon including a core 610 and solder 611, in FIG. 6C the interconnection element is a solder-coated ribbon in which the upper surface is convex to enhance light scattering and light trapping in the photovoltaic module, and in FIG. 6D the interconnection element is a solder-coated ribbon in which the upper surface is textured to enhance light scattering and optical trapping in the photovoltaic module.

An interconnection element used to interconnect two solar cell edges can comprise an elastomeric interconnection element. The elastomeric interconnection element can be configured to provide flexibility to the interconnect to accommodate mechanical stress generated at the interconnect during use conditions, such as generated by thermal stress. An elastomeric interconnection element can be an electrically conductive elastomer. The electrically conductive filler can be dispersed homogenously or in homogeneously within the elastomeric interconnection element. For example, the electrically conductive filler can be disposed on the outer surface of the elastomeric interconnection element.

The electrically conductive filler can be in any suitable form such as particles, flakes, filaments, and/or wires. The electrically conductive filler can comprise a suitable amount of a weldable material such as a solder alloy for bonding to the electrically conductive adhesive on the edges of the solar cell.

Any suitable elastomer or combination of elastomers can be used, which can be thermosets or thermoplastic elastomers.

An elastomeric interconnection element can have a core/shell configuration. For example, the interior of the interconnection element can be elastomeric, which is surrounded by a shell of an electrically conductive material. The electrically conductive material can be, for example, an electrically filled elastomer, or a thin electrically conductive foil such as a solder-coated foil.

Exterior surfaces of an elastomeric interconnection element can have exterior (top and bottom) surfaces comprising an environmentally inert material configured to enhance the weatherability of the elastomeric interconnection element. For example, the outer surfaces of the elastomeric interconnection element can comprise a weatherable polymer which covers a shell of an electrically conductive material.

An elastomeric interconnection element can be preformed by methods such as coextrusion and inserted between opposing solar cell edges during assembly. An elastomeric interconnection element can be formed in place using coextrusion methods.

An elastomeric interconnection element can further comprise thermally conductive filler. An elastomeric interconnection element can further comprise filler configured to enhance the mechanical robustness and stability of the interconnect, such as fiber including, for example, silica fiber, carbon fiber, metal fiber, and/or organic fiber.

Figure 7A:
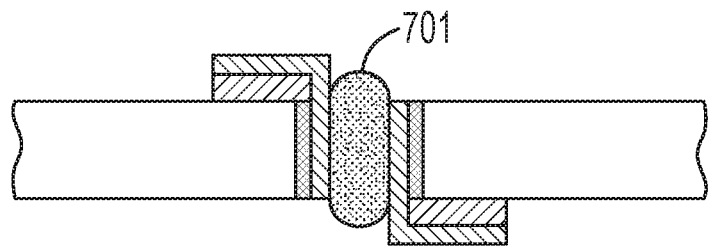
FIGS. 7A-7D show side views of solar cells interconnected using an electrically conductive elastomer (7A) or an electrically conductive elastomeric element (7B-7D).
Figure 7B:
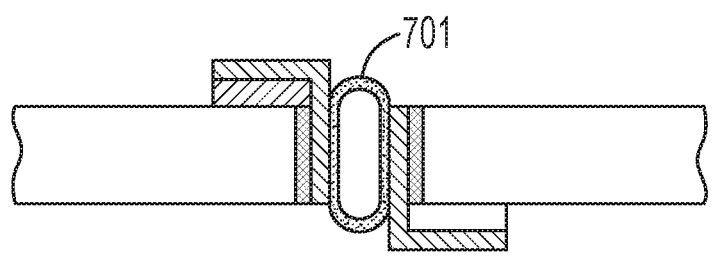
Figure 7C:
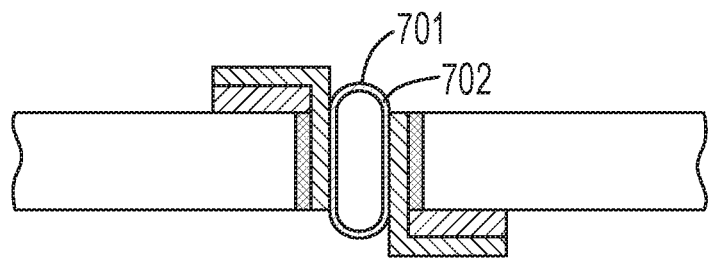
Figure 7D:
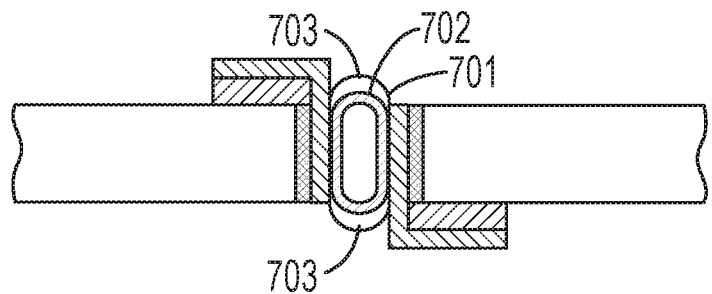

FIGS. 7A-7B show cross-sectional views of examples of solar cells interconnected using elastomeric interconnection elements (701). FIG. 7A shows solar cells interconnected using an electrically conductive elastomer in which the electrically conductive filler is homogenously dispersed throughout the elastomeric interconnection element. FIG. 7B shows solar cells interconnected using an electrically conductive elastomer in which the electrically conductive filler is disposed on the exterior surface of the elastomeric interconnection element. FIG. 7C shows an elastomeric interconnection element comprising an exterior electrically conductive thin-film 702. FIG. 7D shows an elastomeric interconnection element comprising an electrically conductive film 702 in which the exposed exterior surfaces of the element comprise a weatherable material 703.

Solar cells provided by the present disclosure can be incorporated into photovoltaic modules, and the photovoltaic modules can be incorporated into power generation systems. Thus, aspects of the invention include photovoltaic modules and power generation systems comprising solar cell edge interconnects provided by the present disclosure.

Solar cell modules interconnected using the edge interconnects provided by the present disclosure can maintain acceptable conductivity and adhesion strength following exposure to accelerated environmental test conditions including damp-heat testing and accelerated thermal cycling, which are used to qualify solar cells for a 25-year service life.

The use of solar cell edge interconnects provided by the present disclosure can facilitate the use of small-area solar cells. It is estimated that the output of a solar cell module interconnected using the disclosed methods will have approximately 2% improvement in absolute module efficiency compared to a solar cell module interconnected using traditional front-to-back ribbons and about 0.3% absolute module efficiency improvement over shingled solar cell designs for a bifacial solar cell module.

ASPECTS OF THE INVENTION

The invention is further defined by the following aspects.

Aspect 1. A solar cell, wherein the solar cell comprises: a surface and an edge; a busbar, wherein the busbar is in proximity to the edge; a dielectric layer overlying the edge; and an electrically conductive adhesive overlying at least a portion of the dielectric layer and overlying at least a portion of the busbar.

Aspect 2. The solar cell of aspect 1, wherein the electrically conductive adhesive comprises Ag, Cu, or a combination thereof.

Aspect 3. The solar cell of any one of aspects 1 to 2, wherein the dielectric layer comprises $SiO_2$, $SiN$, or $Al_2O_3$.

Aspect 4. The solar cell of any one of aspects 1 to 2, wherein the dielectric layer comprises a copper diffusion barrier dielectric material.

Aspect 5. The solar cell of aspect 4, wherein the copper diffusion barrier dielectric material comprises titanium, silicon nitride, $ZrB_2$, $MnSi_xO_y$, or a combination of any of the foregoing.

Aspect 6. The solar cell of any one of aspects 1 to 5, wherein the dielectric layer is configured to passivate the edge.

Aspect 7. The solar cell of any one of aspects 1 to 6, wherein the solar cell comprises a silicon substrate.

Aspect 8. The solar cell of any one of aspects 1 to 7, further comprising a solder paste overlying at least a portion of the electrically conductive adhesive.

Aspect 9. The solar cell of aspect 8, wherein the solder paste comprises Sn; and Ag, Cu, Pb, or a combination of any of the foregoing.

Aspect 10. A solar cell module, comprising: a first solar cell of any one of aspects 1 to 9, wherein the first solar cell comprises a first electrically conductive adhesive; a second solar cell of any one of aspects 1 to 9, wherein the second solar cell comprises a second electrically conductive adhesive; and an interconnection element interconnecting the first electrically conductive adhesive and the second electrically conductive adhesive.

Aspect 11. The solar cell module of aspect 10, wherein the interconnection element comprises a solder paste.

Aspect 12. The solar cell module of aspect 11, wherein the solder paste comprises Sn; and Ag, Cu, Pb, Bi, or a combination of any of the foregoing.

Aspect 13. The solar cell module of any one of aspects 10 to 12, wherein the interconnection element comprises a solder-coated ribbon.

Aspect 14. The solar cell module of aspect 13, wherein the outer surfaces of the solder-coated ribbon are rounded, textured, or a combination thereof.

Aspect 15. The solar cell module of any one of aspects 13 to 14, wherein the solder-coated ribbon has a round cross-sectional profile or an oval cross-sectional profile.

Aspect 16. The solar cell module of any one of aspects 13 to 15, wherein the solder-coated ribbon comprises a solder-coated copper foil.

Aspect 17. The method of any one of aspects 10 to 16, wherein the interconnection element comprises an elastomeric interconnection element.

Aspect 18. The solar cell module of any one of aspects 13 to 17, wherein the solder-coated ribbon comprises a coating of Sn; and Ag, Cu, Pb, or a combination of any of the foregoing.

Aspect 19. The solar cell module of any one of aspects 10 to 18, wherein the interconnection element has a width less than 250 μm.

Aspect 20. The solar cell module of any one of aspects 10 to 18, wherein the interconnection element has a width from 50 μm to 250 μm.

Aspect 21. The solar cell module of any one of aspects 10 to 20, wherein the interconnection element has a thickness within ±10% the thickness of the solar cell.

Aspect 22. The solar cell module of any one of aspects 10 to 21, wherein the interconnection element has a thickness less than 200 μm.

Aspect 23. The solar cell module of any one of aspects 10 to 21, wherein the interconnection element has a thickness from 50 μm to 200 μm.

Aspect 24. The solar cell module of any one of aspects 10 to 23, wherein the first solar cell and the second solar cell are coplanar.

Aspect 25. The solar cell module of any one of aspects 10 to 24, wherein a busbar on the frontside of the first solar cell is electrically interconnected to a busbar on the backside of the second solar cell.

Aspect 26. A photovoltaic module comprising at least two solar cells of any one of aspects 1 to 9.

Aspect 27. A power system comprising a plurality of the photovoltaic modules of aspect 26.

Aspect 28. A method of fabricating a solar cell edge interconnect, comprising: depositing a dielectric layer overlying an edge of a solar cell; depositing a busbar metallization in proximity to the edge of the solar cell; and depositing an electrically conductive adhesive overlying at least a portion of the dielectric layer and overlying at least a portion of the busbar to provide a solar cell edge interconnect.

Aspect 29. The method of aspect 28, further comprising, after depositing the busbar metallization, curing the busbar metallization to form a busbar.

Aspect 30. The method of any one of aspects 28 to 29, further comprising, after depositing the electrically conductive adhesive, curing the electrically conductive adhesive.

Aspect 31. The method of aspect 30, further comprising, after curing the electrically conductive adhesive, depositing a solder paste overlying at least a portion of the cured electrically conductive adhesive.

Aspect 32. The method of aspect 31, wherein depositing the solder paste comprises additive manufacturing.

Aspect 33. The method of any one of aspects 28 to 32, further comprising, after depositing the dielectric layer, depositing the busbar in proximity to the edge of a solar cell.

Aspect 34. The method of aspect 32, wherein depositing the busbar comprises screen printing a metallization paste.

Aspect 35. The method of any one of aspects 28 to 34, wherein depositing the dielectric layer comprises chemical vapor deposition.

Aspect 36. The method of any one of aspects 28 to 34, wherein depositing the electrically conductive adhesive comprises additive manufacturing.

Aspect 37. A solar cell comprising an interconnect fabricated using the method of any one of aspects 28 to 36.

Aspect 38. A photovoltaic module comprising at least two solar cells of aspect 37.

Aspect 39. A power system comprising a plurality of the photovoltaic modules of aspect 38.

Aspect 40. A method of interconnecting solar cells, comprising: contacting a first electrically conductive adhesive of a first solar cell of any one of aspects 1 to 9 and a second electrically conductive adhesive of a second solar cell of any one of aspects 1 to 9 with an interconnection element; and bonding the interconnection element to the first and second electrically conductive adhesives to electrically interconnect the first solar cell and the second solar cell.

Aspect 41. The method of aspect 40, wherein the interconnection element comprises a solder paste.

Aspect 42. The method of any one of aspects 40 to 41, wherein the interconnection element comprises a solder-coated ribbon.

Aspect 43. The method of aspect 42, wherein outer surfaces of the solder-coated ribbon are rounded, textured, or a combination thereof.

Aspect 44. The method of any one of aspects 42 to 43, wherein the solder-coated ribbon has a round cross-sectional profile or an oval cross-sectional profile.

Aspect 45. The method of any one of aspects 42 to 44, wherein the solder-coated ribbon comprises a solder-coated Cu foil.

Aspect 46. The method of any one of aspects 42 to 45, wherein the solder-coated ribbon comprises a coating of Sn; and Ag, Cu, Pb, Bi or a combination of any of the foregoing.

Aspect 47. The method of any one of aspects 40 to 46, wherein the interconnection element has a width less than 250 μm.

Aspect 48. The method of any one of aspects 40 to 46, wherein the interconnection element has a width from 50 μm to 250 μm.

Aspect 49. The method of any one of aspects 40 to 48, wherein the interconnection element has a thickness that is less than ±10% the thickness of the solar cell.

Aspect 50. The method of any one of aspects 40 to 49, wherein the interconnection element has a thickness less than 200 μm.

Aspect 51. The method of any one of aspects 40 to 49, wherein the interconnection element has a thickness from 50 μm to 200 μm.

Aspect 52. The method of any one of aspects 40 to 50, wherein the interconnection element comprises an elastomeric interconnection element.

Aspect 53. The method of aspect 52, wherein the elastomeric interconnection element comprises an electrically conductive elastomer.

Aspect 54. The method of any one of aspects 52 to 53, wherein at least a portion of the exterior surface of the elastomeric interconnection element is electrically conductive.

Aspect 55. The method of any one of aspects 52 to 54, wherein at least a portion of the interior of the elastomeric interconnection element is electrically conductive.

Aspect 56. The method of any one of aspects 40 to 55, wherein the method further comprises depositing the interconnection element between the first solar cell and the second solar cell.

Aspect 57. The method of aspect 56, wherein depositing the interconnection element comprises depositing using additive manufacturing.

Aspect 58. The method of any one of aspects 40 to 57, wherein contacting comprises: bringing the first electrically conductive adhesive in proximity to the second electrically conductive adhesive; and depositing an interconnection element to contact both the first electrically conductive adhesive in proximity to the second electrically conductive adhesive.

Aspect 59. The method of aspect of any one of 40 to 58, wherein the interconnection element comprises a solder paste.

Aspect 60. The method of any one of aspects 40 to 58, wherein the interconnection element comprises an electrically conductive elastomer.

Aspect 61. The method of any one of aspects 40 to 58, wherein the interconnection element comprises an electrically conductive elastomeric element.

Aspect 62. The method of any one of aspects 40 to 61, wherein the first solar cell further comprises a solder paste overlying at least a portion of the first electrically conductive adhesive; and contacting comprises bringing the solder paste into contact with the second electrically conductive adhesive.

Aspect 63. The method of any one of aspects 40 to 61, wherein, the first solar cell further comprises a first solder paste overlying at least a portion of the first electrically conductive adhesive; the second solar cell further comprises a second solder paste overlying at least a portion of the second electrically conductive adhesive; and contacting comprises contacting the first solder paste to the second solder paste.

Aspect 64. Solar cells interconnected using the method of any one of aspects 40 to 63.

Aspect 65. A photovoltaic module comprising the solar cells of aspect 64.

Aspect 66. A power system comprising a plurality of the photovoltaic modules of aspect 65.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled to their full scope and equivalents thereof.

What is claimed is:

1. A method of fabricating a solar cell edge interconnect, comprising:
    depositing a dielectric layer overlying a peripheral side edge of a solar cell;
    depositing a busbar metallization overlying a surface of the solar cell in proximity to the peripheral side edge of the solar cell; and
    depositing an electrically conductive adhesive overlying at least a portion of the dielectric layer and overlying at least a portion of the busbar to provide a solar cell edge interconnect.

2. The method of claim 1, wherein the dielectric layer is configured to passivate the peripheral side edge.

3. The method of claim 1, wherein the electrically conductive adhesive covers the dielectric layer.

4. The method of claim 1, further comprising, after depositing the electrically conductive adhesive, curing the electrically conductive adhesive.

5. The method of claim 4, further comprising, after curing the electrically conductive adhesive, depositing a solder paste overlying at least a portion of the cured electrically conductive adhesive.

6. The method of claim 5, wherein depositing the solder paste comprises depositing using additive manufacturing.

7. The method of claim 1, wherein depositing the dielectric layer comprises depositing using chemical vapor deposition.

8. The method of claim 1, wherein depositing the electrically conductive adhesive comprises depositing using additive manufacturing.

9. The method of claim 1, further comprising applying a non-electrically conductive elastomeric component on a portion of the peripheral side edge of the solar cell.

10. A solar cell comprising an edge interconnect fabricated using the method of claim 1.

11. A photovoltaic module comprising the solar cell of claim 10.

12. A power system comprising a plurality of the photovoltaic modules of claim 11.

* * * * *